(12) United States Patent
Aikawa (10) Patent No.: US 6,288,934 B1
(45) Date of Patent: Sep. 11, 2001

(54) ANALOG MEMORY DEVICE AND METHOD FOR READING DATA STORED THEREIN

(75) Inventor: Makoto Aikawa, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/656,028

(22) Filed: Sep. 6, 2000

(51) Int. Cl.$^7$ .................................................. G11C 16/04
(52) U.S. Cl. ........................... 365/185.03; 365/185.09; 365/45
(58) Field of Search ....................... 365/185.03, 185.09, 365/45

(56) References Cited

U.S. PATENT DOCUMENTS 5,606,522 * 2/1997 Chai .................................. 365/185.03
5,638,320 6/1997 Wong et al. .
6,151,246 * 11/2000 So et al. .......................... 365/185.09

FOREIGN PATENT DOCUMENTS 8-125719 5/1996 (JP) .
2000-68833 3/2000 (JP) .

* cited by examiner

Primary Examiner—Huan Hoang
(74) Attorney, Agent, or Firm—Jones Volentine, PLLC (57) ABSTRACT

A read-out circuit, includes a data detecting circuit which detects analog data of a selected memory cell; a data condition deciding circuit which decides whether or not the analog data detected by the data detecting circuit is in a normal range; and a controller which normalizes an output signal for the selected memory cell in accordance with the decision of the data condition deciding circuit.

23 Claims, 8 Drawing Sheets

ANALOG MEMORY DEVICE AND METHOD FOR READING DATA STORED THEREIN

TECHNICAL FIELD OF THE INVENTION

The present invention relates to an analog memory device, such as EPROM, EEPROM and flash memory. More particularly, the present invention relates to method and circuit for reading analog data stored in a memory cell array.

BACKGROUND OF THE INVENTION

Three common types of non-volatile memory, such as EPROM (Electrically Programmable Read Only Memory), EEPROM (Electrically Erasable Programmable Read Only Memory), and flash memory use charge on a memory cell's floating gate to control the threshold voltage of the memory cell and indicate the state of the cell. Typically, binary memory cells have two states, one indicated by a high threshold voltage and one indicated by a low threshold voltage. Gathering electrons on a memory cell's floating gate increases the cell's threshold voltage and is referred to as writing or programming the memory cell. Erasing a memory cell removes electrons from the floating gate and reduces the threshold voltage.

A conventional flash memory includes a memory array, a slow ramp circuit, a column decoder, a row decoder, a sense amplifier, a pulse generating circuit and a sample and hold circuit. The flash memory array includes a large number of memory cells, each storing analog data as its threshold gate voltage, such as an audio signal continuously changing in level with the passage of time. The slow ramp circuit is connected at output terminals to the column decoder and sample and hold circuit. The slow ramp circuit supplies a control gate voltage, which is increased continuously or step-wise from a predetermined lowest level. The control gate voltage may be decreased continuously or step-wise from a predetermined highest level.

The column decoder is connected at an output terminal to the flash memory array to select a column including a selected memory cell. The row decoder is connected at an input terminal to the flash memory array and at an output terminal to the sense amplifier. When the control gate voltage applied to the selected memory cell increases and reach its threshold level, a drain current starts flowing through the selected memory cell. Such a drain current is supplied to the sense amplifier.

The sense amplifier is connected at an output terminal to an input terminal of the pulse generating circuit. The sense amplifier detects the drain current of the selected memory cell and reverses its output when the current exceeds a predetermined threshold level. The pulse generating circuit is connected at an output terminal to another input terminal of the sample and hold circuit. In response to the output signal of the sense amplifier, the pulse generating circuit generates and supplies a sampling signal to the sample and hold circuit. The sample and hold circuit samples and holds the control gate voltage supplied from the slow ramp circuit in response to the sampling signal from the pulse generating circuit. The sample and hold circuit supplies such a control gate voltage, corresponding to the threshold gate voltage of the selected memory cell, as an analog output signal.

According to the conventional analog memory, however, some error signals may be outputted when the flash memory array includes some failure bits. If such a conventional analog memory is used in a voice recorder, noise sounds would be made.

OBJECTS OF THE INVENTION

Accordingly, an object of the present invention is to provide method and circuit for reading analog data stored in memory cells, in which failure signals are prevented from being outputted.

Another object of the present invention is to provide an analog memory device, in which failure signals are prevented from being outputted.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a read-out circuit, includes a data detecting circuit which detects analog data of a selected memory cell; a data condition deciding circuit which decides whether or not the analog data detected by the data detecting circuit is in a normal range; and a controller which normalizes an output signal for the selected memory cell in accordance with the decision of the data condition deciding circuit.

According to a second aspect of the present invention, a method includes detecting data of a selected memory cell; deciding whether or not the detected data of the selected memory cell is in a normal range, and normalizing an output signal for the selected memory cell in accordance with the decision.

According to a third aspect of the present invention, an analog memory device is provided with a read-out circuit according to the above described first aspect of the present invention.

DETAILED DISCLOSURE OF THE INVENTION

In the following detailed description of the preferred embodiments, reference is made to the accompanying drawings which forma part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 1:
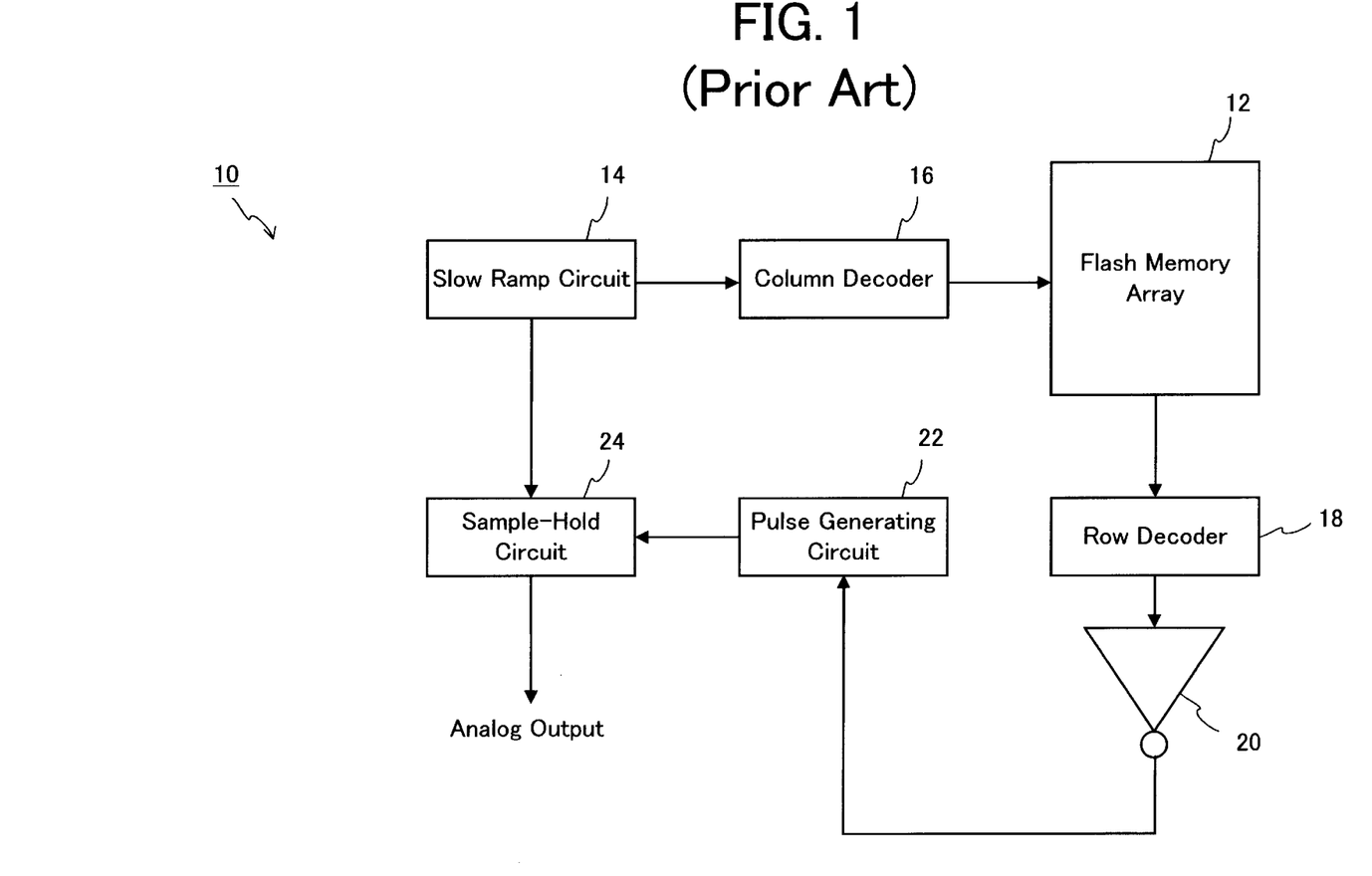
FIG. 1 is a block diagram illustrating a conventional flash memory.

For better understanding of the present invention, a conventional analog accumulated type of non-volatile memory is first described. FIG. 1 shows a conventional flash memory 10 for voice signals, which includes a flash memory array 12, a slow ramp circuit 14, a column decoder 16, a row decoder 18, a sense amplifier 20, a pulse generating circuit 22 and a sample and hold circuit 24. The flash memory array 12 includes a large number of memory cells, each storing analog data as its threshold gate voltage. The stored data may be audio signals, which continuously change in level with the passage of time. The slow ramp circuit 14 is connected at output terminals to the column decoder 16 and sample and hold circuit 24. The slow ramp circuit 14 supplies a control gate voltage, which is increased continuously or step-wise from a predetermined lowest level. The control gate voltage may be decreased continuously or step-wise from a predetermined highest level.

The column decoder 16 is connected at an output terminal to the flash memory array 12 to select a column to be accessed so that only the selected column is supplied with the control voltage from the slow ramp circuit 14. The row decoder 18 is connected at an input terminal to the flash memory array 12 and at an output terminal to an input terminal of the sense amplifier 20. When the control gate voltage applied to the selected memory cell increases and reach its threshold voltage level, drain current starts flowing through the selected memory cell. Such a drain current is supplied to the sense amplifier 20.

The sense amplifier 20 is connected at an output terminal to an input terminal of the pulse generating circuit 22. The sense amplifier 20 detects the drain current of the selected memory cell and reverses it. The pulse generating circuit 22 is connected at an output terminal to another input terminal of the sample and hold circuit 24. In response to the output signal of the sense amplifier 20, the pulse generating circuit 22 generates and supplies a sampling signal to the sample and hold circuit 24. The sample and hold circuit 24 samples and holds the control gate voltage supplied from the slow ramp circuit 14 in response to the sampling signal from the pulse generating circuit 22. The sample and hold circuit 24 supplies an analog output signal corresponding to the threshold gate voltage of the selected memory cell.

According to the conventional analog memory device, however, some error or failure signals may be outputted when the flash memory array 12 includes some failure bits. If such a conventional analog memory is used in a voice recorder, noise sounds would be made.

Figure 2:
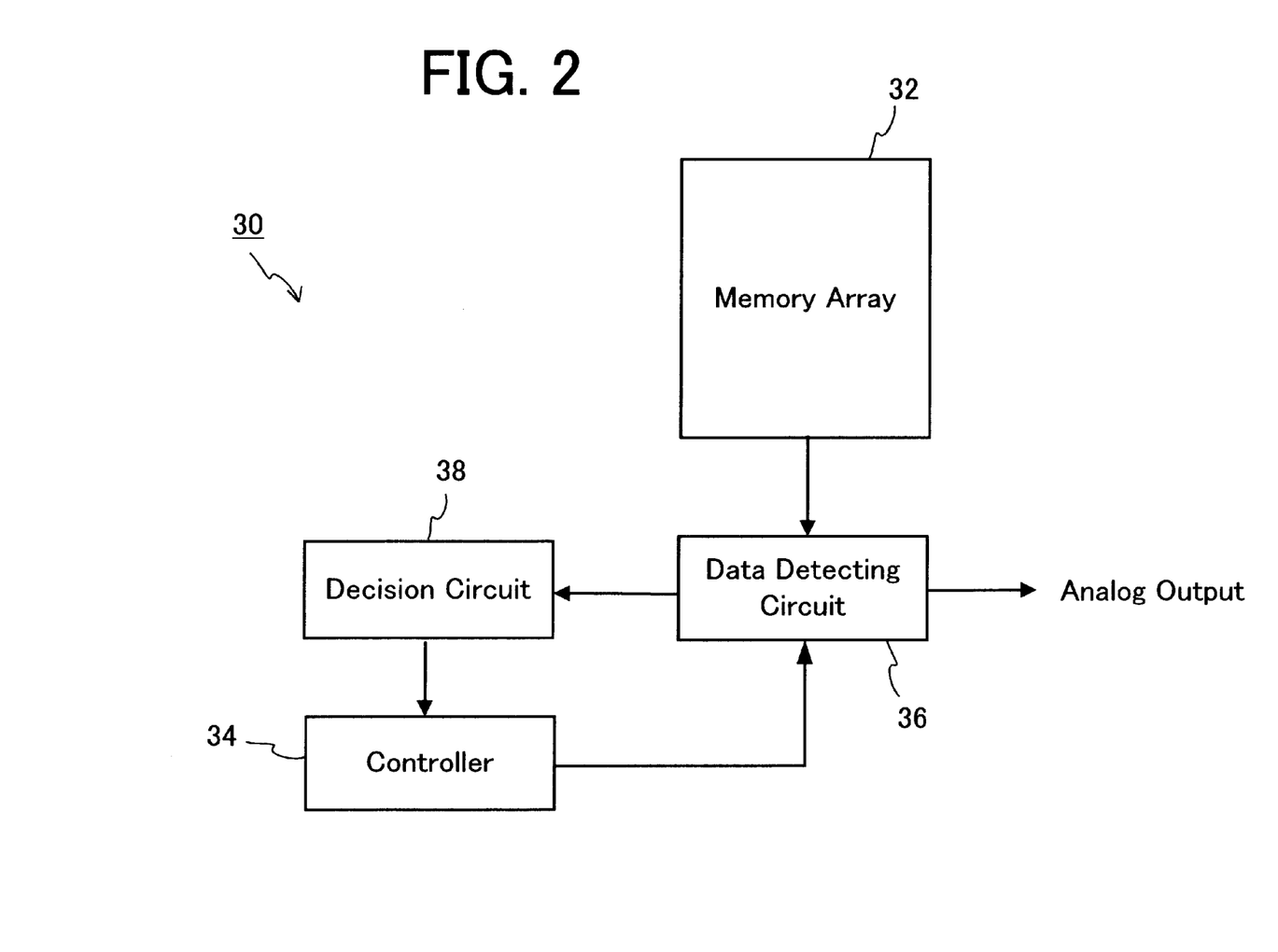
FIG. 2 is a block diagram illustrating a flash memory according to the general idea of the present invention.

FIG. 2 shows a flash memory 30 according to the general idea of the present invention. The flash memory 30 includes a flash memory array 32, a controller 34, a data detecting circuit 36 and a decision circuit 38. The flash memory array 32 includes a large number of memory cells, each storing analog data, such as audio signals, which continuously change in level with the passage of time. The data detecting circuit 36 is connected at input terminals to the memory array 32 and the controller 34, and at an output terminal to the decision circuit 38. The decision circuit 38 is connected at an output terminal to the controller 34.

The data detecting circuit 36 detects data stored in a selected memory cell in the memory array 32 and supplies the detected data to the decision circuit 38. The decision circuit 38 decides whether the detected data of the selected memory cell is in a normal range and supplies the decision result to the controller 34. If the detected data of the selected memory cell is out of the normal range, the controller normalized the data to provide an appropriated analog output signal.

According to the present invention, even if the memory array 32 includes some failure bits, no error or strange signals are outputted. If such an analog memory is used in a voice recorder, noise sounds is prevented from being made due to defectiveness of a memory array.

Figure 3:
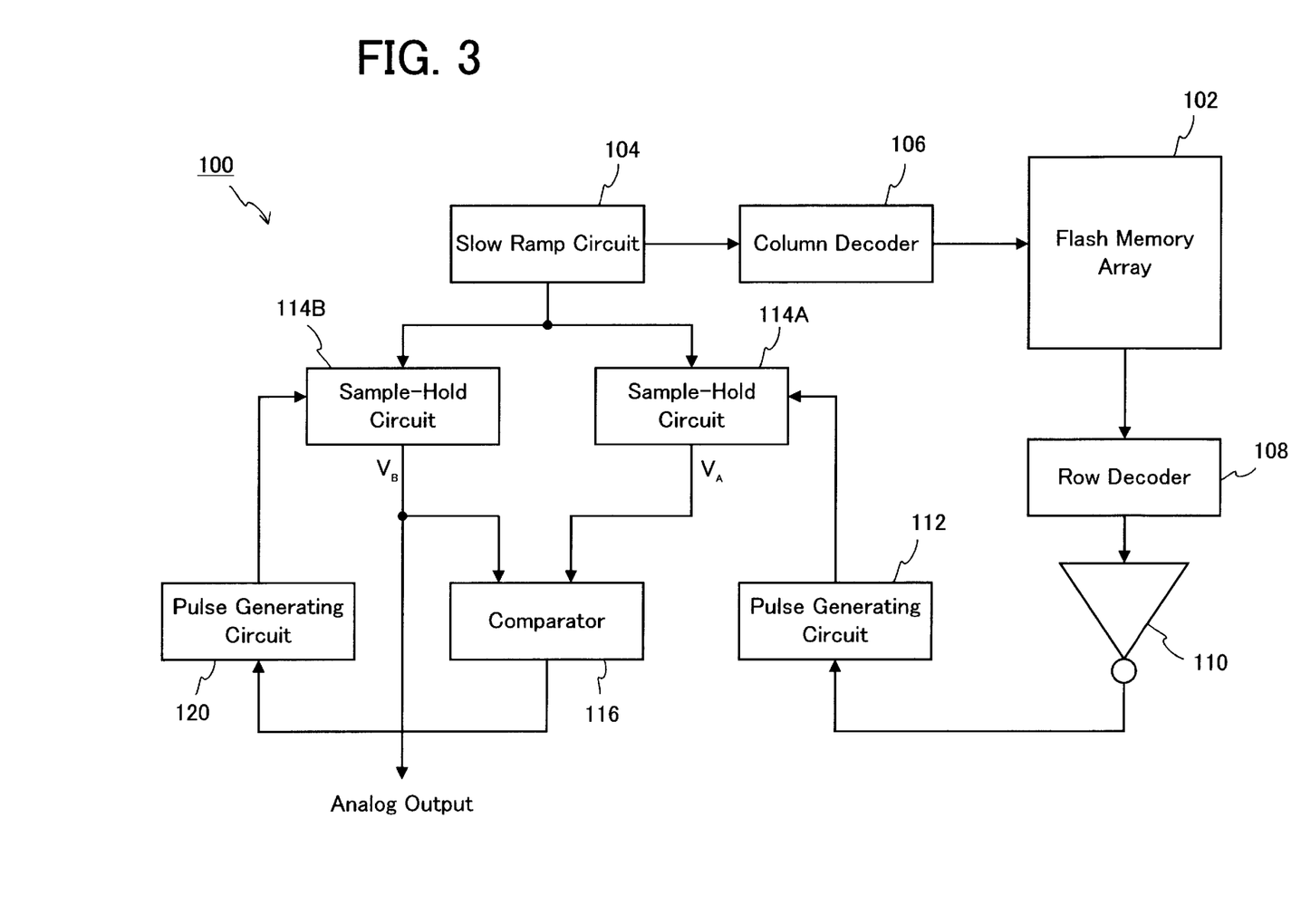
FIG. 3 is a block diagram illustrating a flash memory according to a first preferred embodiment of the present invention.

FIG. 3 shows a flash memory 100 according to a first preferred embodiment of the present invention. The flash memory 100 includes a flash memory array 102, a slow ramp circuit 104, a column decoder 106, a row decoder 108, a sense amplifier 110, a pulse generating circuit 112, sample and hold circuits 114A and 114B, a comparator 116 and another pulse generating circuit 120.

The flash memory array 102 includes a large number of memory cells, each storing analog data as its threshold gate voltage. The analog data may be audio signals, which continuously change in level with the passage of time. The slow ramp circuit 104 is connected at output terminals to the column decoder 106 and sample and hold circuits 114A and 114B. The slow ramp circuit 104 supplies a control gate voltage, which is increased continuously or step-wise from a predetermined lowest level. The control gate voltage may be decreased continuously or step-wise from a predetermined highest level.

The column decoder 106 is connected at an output terminal to the flash memory array 102 to select a column to be accessed so that only the selected column is supplied with the control voltage from the slow ramp circuit 104. The row decoder 108 is connected at an input terminal to the flash memory array 102 and at an output terminal to an input terminal of the sense amplifier 110. When the control gate voltage applied to the selected memory cell increases and reach its threshold gate voltage, drain current starts flowing through the selected memory cell. Such a drain current is supplied to the sense amplifier 110.

The sense amplifier 110 is connected at an output terminal to an input terminal of the pulse generating circuit 112. The sense amplifier 110 detects the drain current of the selected memory cell and reverses it. The pulse generating circuit 112 is connected at an output terminal to another input terminal of the sample and hold circuit 114A.

In response to the output signal of the sense amplifier 110, the pulse generating circuit 112 generates and supplies a sampling signal to the sample and hold circuit 114A. The sample and hold circuit 114A samples and holds the control gate voltage supplied from the slow ramp circuit 104 in response to the sampling signal from the pulse generating circuit 112.

The sample and hold circuit 114A is connected at an output terminal to an input terminal of the comparator 116. The sample and hold circuit 114A samples and holds the control gate voltage as the threshold gate voltage $V_A$ of the selected memory cell and supplies it to the comparator 116 in response to a sampling signal from the pulse generating circuit 112.

The sample and hold circuit 114B is connected at an output terminal to the other input terminal of the comparator 116. The sample and hold circuit 114B samples and holds the threshold gate voltage $V_A$ of the selected memory cell and also stores the latest output signal $V_{B(t-1)}$, which has been outputted one step prior to the current step. The sample and hold circuit 114B supplies the threshold gate voltage of the selected memory cell as an analog output $V_B$ when a sampling signal is supplied from the pulse generating circuit 120. On the other hand, the sample and hold circuit 114B again supplies the latest output signal $V_{B(t-1)}$ as an analog output signal $V_B$ when no sampling signal is supplied from the pulse generating circuit 120.

The comparator 116 is connected at an output terminal to an input terminal of the pulse generating circuit 120. The pulse generating circuit 120 is connected at an output terminal to an input terminal of the sample and hold circuit 114B. The comparator 116 compares the difference between the threshold gate voltage $V_A$ of the currently selected memory cell and the latest output signal $V_{B(t-1)}$ to a predetermined reference value $V_{ref}$. When the following formula (1) is met, the comparator 116 supplies a drive signal to the pulse generating circuit 120:

$$|V_A - V_{B(t-1)}| < V_{ref} \quad (1)$$

On the other hand, when the following formula (2) is met, the comparator 116 supplies no drive signal to the pulse generating circuit 120:

$$|V_A - V_{B(t-1)}| > V_{ref} \quad (2)$$

It can be considered from the above description that the selected memory cell is normally operating when the formula (1) is met, while the selected memory cell is out of order when the formula (2) is met.

In operation, the comparator 116 compares the difference between the latest output signal $V_{B(t-1)}$ and the threshold gate voltage $V_{A(t)}$ of the selected memory cell to the reference value $V_{ref}$. As a result of the comparison, if the difference between the latest output signal $V_{B(t-1)}$ and the threshold gate voltage $V_{A(t)}$ of the selected memory cell is smaller than the reference value $V_{ref}$, the comparator 116 supplies a drive signal to the pulse generating circuit 120. In response to the drive signal, the pulse generating circuit 120 generates and supplies a sampling signal to the sample and hold circuit 114B. When the sampling signal is supplied to the sample and hold circuit 114B, an analog output signal $V_B$ corresponding to the threshold gate voltage $V_{A(t)}$ of the selected memory cell is outputted.

On the other hand, as a result of the comparison, if the difference between the latest output signal $V_{B(t-1)}$ and the threshold gate voltage $V_{A(t)}$ of the selected memory cell is larger than the reference value $V_{ref}$, the comparator 116 supplies no drive signal to the pulse generating circuit 120. The sample and hold circuit 114B supplies the latest output signal $V_{B(t-1)}$ as an analog output signal $V_B$ instead of the threshold gate voltage $V_{A(t)}$ of the currently selected memory cell.

Figure 4:
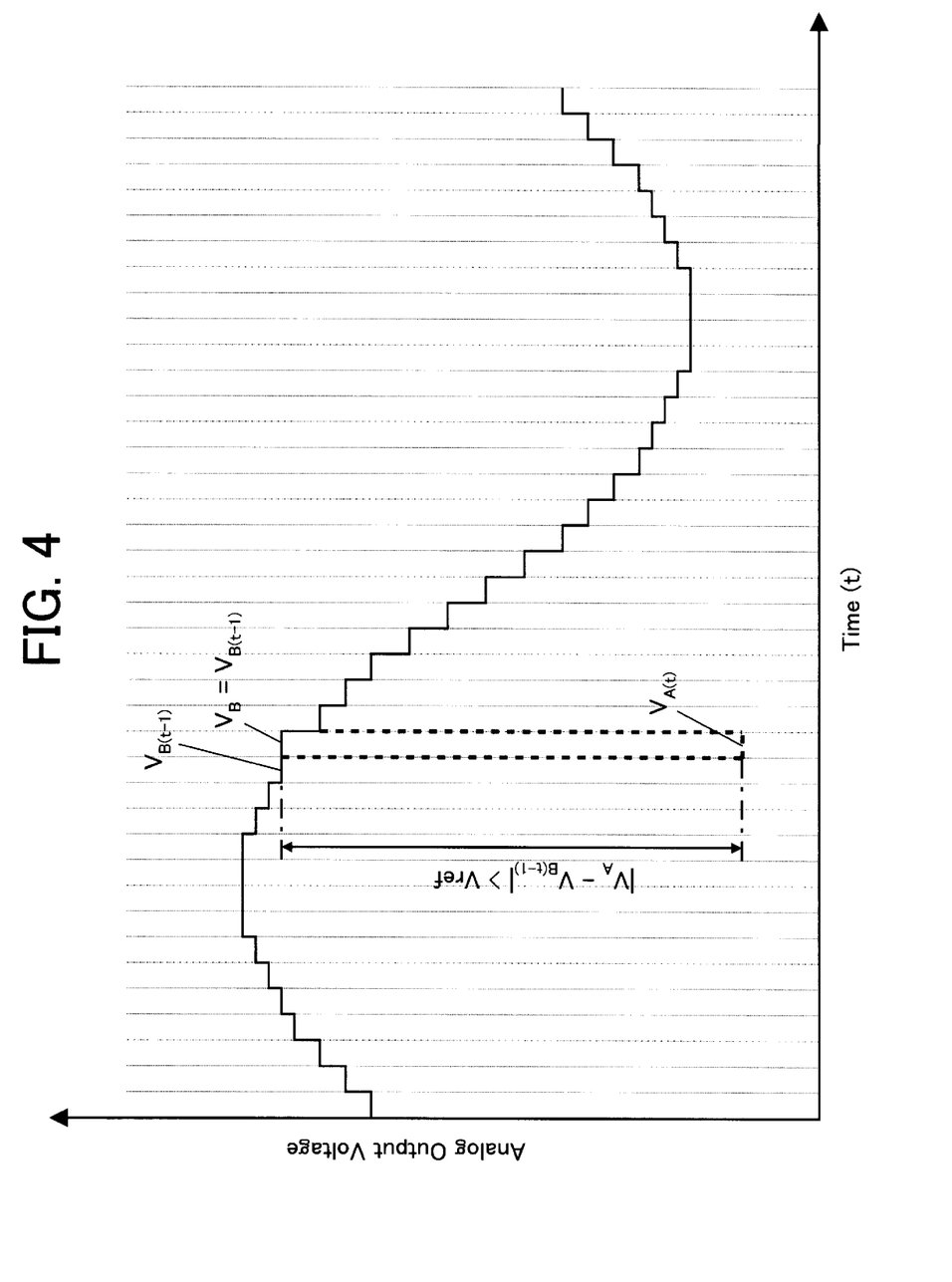
FIG. 4 is a graph showing the operation of the first preferred embodiment, shown in FIG. 3.

FIG. 4 shows the operation of the first preferred embodiment, shown in FIG. 3. As shown in FIG. 4, at a sampling time (t-1), an analog output signal $V_{B(t-1)}$ is outputted. At a sampling time (t), the threshold gate voltage $V_{A(t)}$ of the selected memory cell is out of the normal operation range, that is, $|V_A - V_{B(t-1)}| > V_{ref}$, so that the latest output signal $V_{B(t-1)}$ is again outputted as an analog output signal $V_B$ instead of $V_{A(t)}$.

According to the first preferred embodiment, even if the flash memory array 102 includes some failure bits, no error or strange signals are outputted from the memory device. If such an analog memory is used in a voice recorder, noise sounds is prevented from being made due to defectiveness of a memory array.

Figure 5:
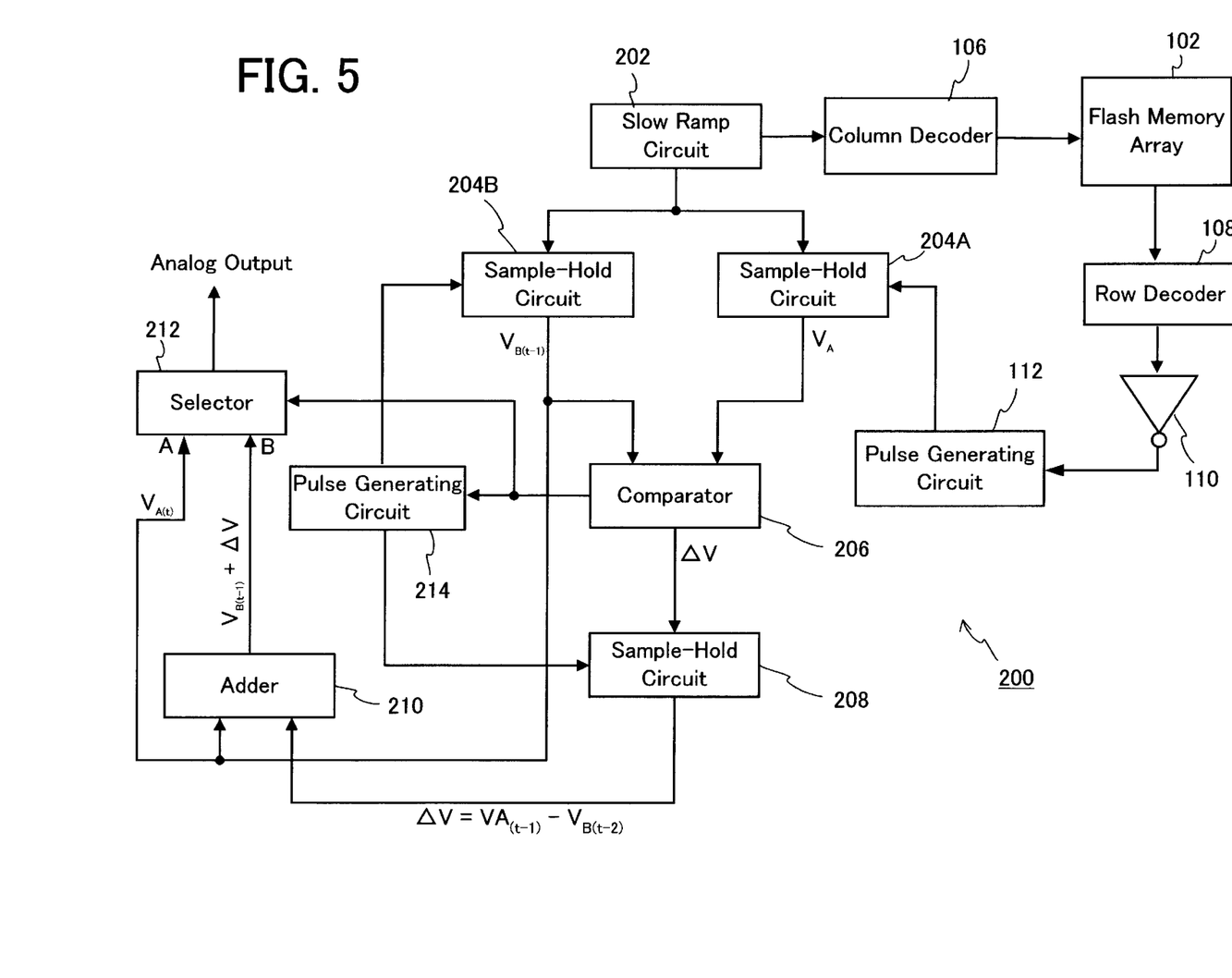
FIG. 5 is a block diagram illustrating a flash memory according to a second preferred embodiment of the present invention.

FIG. 5 shows a flash memory 200 according to a second preferred embodiment of the present invention. The flash memory 200 includes a flash memory array 102, a slow ramp circuit 204, a column decoder 106, a row decoder 108, a sense amplifier 110, a pulse generating circuit 112, sample and hold circuits 204A and 204B, a comparator 206, another sample and hold circuit 208, an adder 210, a selector 212 and another pulse generating circuit 214.

The flash memory array 102 includes a large number of memory cells, each storing analog data as its threshold gate voltage. The analog data may be audio signals, which continuously change in level with the passage of time. The slow ramp circuit 202 is connected at output terminals to the column decoder 106 and sample and hold circuits 204A and 204B. The slow ramp circuit 202 supplies a control gate voltage, which is increased continuously or step-wise from a predetermined lowest level. The control gate voltage may be decreased continuously or step-wise from a predetermined highest level.

The column decoder 106 is connected at an output terminal to the flash memory array 102 to select a column to be accessed so that only the selected column is supplied with the control voltage from the slow ramp circuit 104. The row decoder 108 is connected at an input terminal to the flash memory array 102 and at an output terminal to an input terminal of the sense amplifier 110. When the control gate voltage applied to the selected memory cell increases and reach its threshold gate voltage, drain current starts flowing through the selected memory cell. Such a drain current is supplied to the sense amplifier 110.

The sense amplifier 110 is connected at an output terminal to an input terminal of the pulse generating circuit 112. The sense amplifier 110 detects the drain current of the selected memory cell and reverses it. The pulse generating circuit 112 is connected at an output terminal to another input terminal of the sample and hold circuit 204A.

In response to the output signal of the sense amplifier 110, the pulse generating circuit 112 generates and supplies a sampling signal to the sample and hold circuit 204A. The sample and hold circuit 204A samples and holds the control gate voltage supplied from the slow ramp circuit 202 when the sample signal is supplied from the pulse generating circuit 112.

The sample and hold circuits 204A and 204B samples the control gate voltage supplied from the slow ramp circuit 202. The sample and hold circuit 204A is connected at an output terminal to an input terminal of the comparator 206. The sample and hold circuit 204A samples and holds the control gate voltage as the threshold gate voltage $V_A$ of the selected memory cell and supplies it to the comparator 206 in response to a sampling signal from the pulse generating circuit 112.

The sample and hold circuit 204B is connected at output terminals to the other input terminal of the comparator 206, the adder 210 and an input terminal "A" of the selector 212. The sample and hold circuit 204B samples and holds the threshold gate voltage $V_A$ of the selected memory cell and also stores the latest output signal $V_{B(t-1)}$, which has been outputted one step prior to the current step.

The comparator 206 is connected at output terminals to the sample and hold circuit 208, the pulse generating circuit 214 and the selector 212. The sample and hold circuit 208 is connected at an output terminal to an input terminal of the adder 210. The sample and hold circuit 208 stores a correction value $\Delta V$ supplied from the comparator 206. The correction value $\Delta V$ corresponds to the voltage difference between the latest output signal $V_{B(t-1)}$ and second latest output signal $V_{B(t-2)}$.

The pulse generating circuit 214 is connected at output terminals to input terminals of the sample and hold circuit 204B and 208. The pulse generating circuit 214 supplies sampling signals to the sample and hold circuit 204B and 208 in response to a drive signal from the comparator 206. The adder 210 is connected at an output terminal to an input terminal "B" of the selector 212, which supplies analog output signals.

The comparator 206 compares the difference between the threshold gate voltage $V_A$ of the currently selected memory cell and the latest output signal $V_{B(t-1)}$ to a predetermined reference value $V_{ref}$. When the following formula (3) is met, the comparator 206 supplies a drive signal to the pulse generating circuit 214:

$$|V_A - V_{B(t-1)}| < V_{ref} \quad (3)$$

On the other hand, when the following formula (4) is met, the comparator 116 supplies no drive signal to the pulse generating circuit 120:

$$|V_A - V_{B(t-1)}| > V_{ref} \quad (4)$$

It can be considered from the above description that the selected memory cell is normally operating when the formula (3) is met, while the selected memory cell is out of order when the formula (4) is met.

In operation, the comparator 206 compares the difference between the latest output signal $V_{B(t-1)}$ and the threshold gate voltage $V_{A(t)}$ of the selected memory cell to the reference value $V_{ref}$. As a result of the comparison, if the difference between the latest output signal $V_{B(t-1)}$ and the threshold gate voltage $V_{A(t)}$ of the selected memory cell is smaller than the reference value $V_{ref}$, the comparator 206 supplies a drive signal to the pulse generating circuit 214. In response to the drive signal, the pulse generating circuit 214 generates and supplies sampling signals to the sample and hold circuits 204B and 208, and a selection signal to the selector 212 to select the input terminal A.

When the sampling signal is supplied to the sample and hold circuit 204B, an analog output signal $V_B$ corresponding to the threshold gate voltage $V_{A(t)}$ of the selected memory cell is supplied to the selector 212. At the same time, the sample and hold circuit 208 supplies the correction value $\Delta V$ to the adder 210. The adder 210 adds the correction value $\Delta V$ to the latest output signal voltage $V_{B(t-1)}$, so that the voltage signal "$V_{B(t-1)} + \Delta V$" is supplied to the input terminal "B" of the selector 212. In this case, the selector 212 selects the signal at the input terminal "A" in response to the selection signal from the comparator 206, so that the threshold gate voltage $V_{A(t)}$ of the selected memory cell is outputted normally as an analog output signal.

On the other hand, as a result of the comparison, if the difference between the latest output signal $V_{B(t-1)}$ and the threshold gate voltage $V_{A(t)}$ of the selected memory cell is larger than the reference value $V_{ref}$, the comparator 206 supplies no drive signal to the pulse generating circuit 214. The selector 212 selects the signal at the input terminal "B", so that the voltage signal "$V_{B(t-1)} + \Delta V$" is outputted as an analog output signal.

Figure 6:
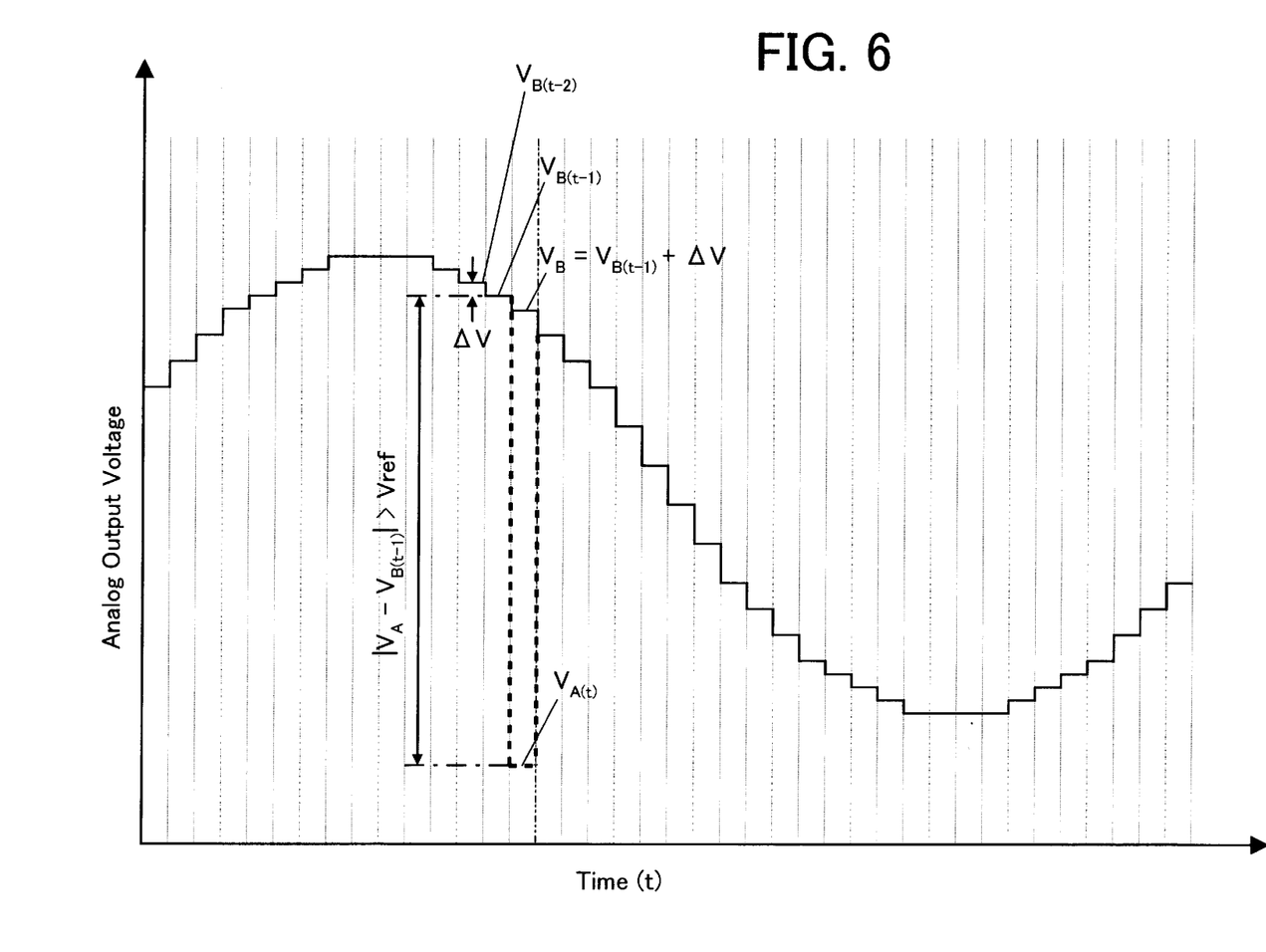
FIG. 6 is a graph showing the operation of the second preferred embodiment, shown in FIG. 5.

FIG. 6 shows the operation of the second preferred embodiment, shown in FIG. 5. As shown in FIG. 6, at a sampling time (t−2), an analog output signal $V_{B(t-2)}$ is outputted, and then, at a sampling time (t−1), an analog output signal $V_{B(t-1)}$ is outputted. At a sampling time (t), the threshold gate voltage $V_{A(t)}$ of the selected memory cell is out of the normal operation range, that is, $|V_A - V_{B(t-1)}| > V_{ref}$, so that the output signal "$V_{B(t-1)} + \Delta V$" is outputted as an analog output signal instead of $V_{A(t)}$.

According to the second preferred embodiment, even if the flash memory array 102 includes some failure bits, no error or strange signals are outputted from the memory device. If such an analog memory is used in a voice recorder, noise sounds is prevented from being made due to defectiveness of a memory array.

Figure 7:
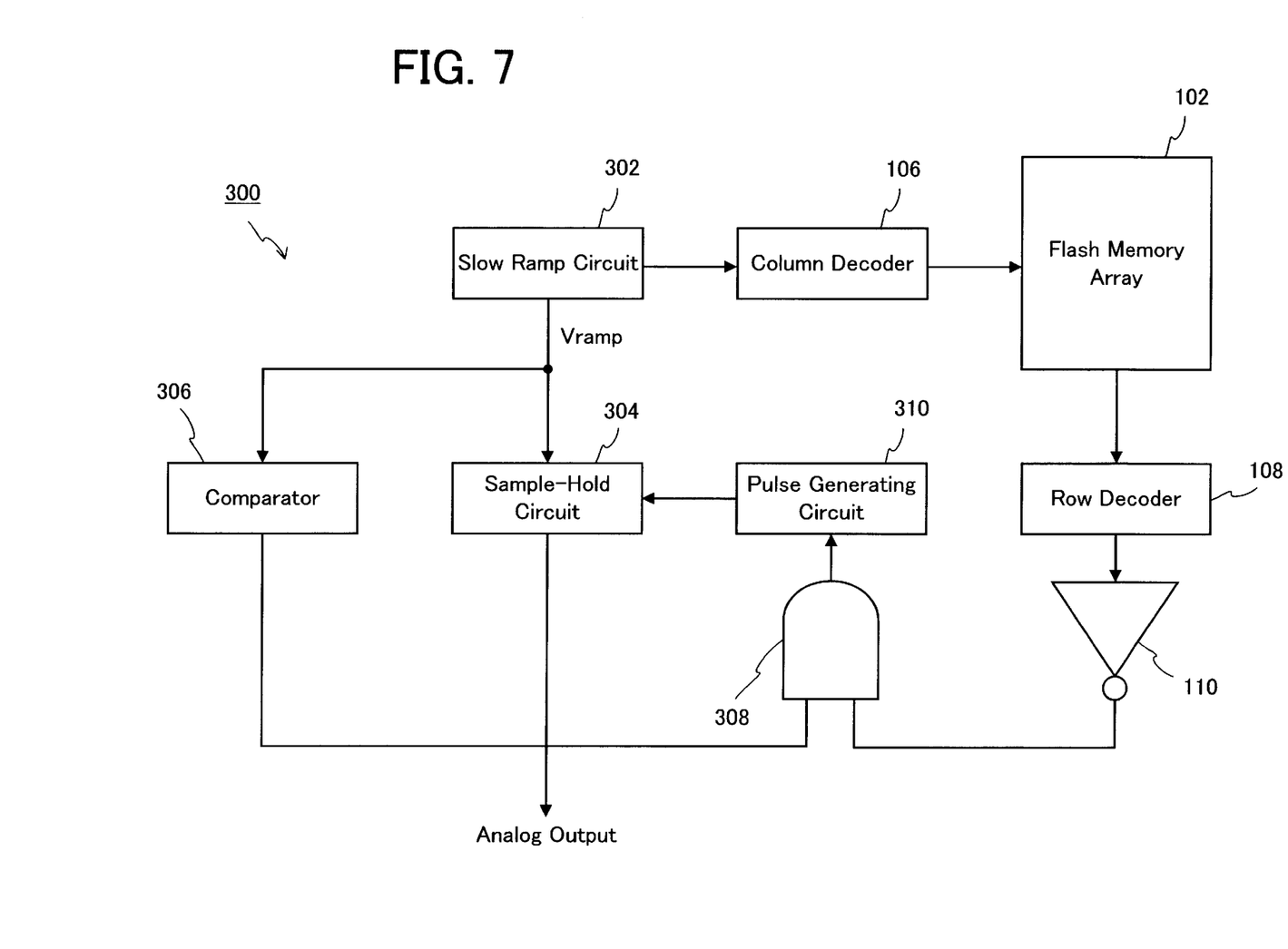
FIG. 7 is a block diagram illustrating a flash memory according to a third preferred embodiment of the present invention.

FIG. 7 shows a flash memory 300 according to a third preferred embodiment of the present invention, in which a threshold gate voltage of a selected memory cell is monitored and selected in absolute manner for output use. The flash memory 300 includes a flash memory array 102, a slow ramp circuit 302, a column decoder 106, a row decoder 108, a sense amplifier 110, an AND gate 308, a pulse generating circuit 310, sample and hold circuit 304 and a comparator 306.

The flash memory array 102 includes a large number of memory cells, each storing analog data as its threshold gate voltage. The analog data may be audio signals, which continuously change in level with the passage of time. The slow ramp circuit 302 is connected at output terminals to the column decoder 106, sample and hold circuit 304 and comparator 306. The slow ramp circuit 302 supplies a control gate voltage, which is increased continuously or step-wise from a predetermined lowest level. The control gate voltage may be decreased continuously or step-wise from a predetermined highest level.

The column decoder 106 is connected at an output terminal to the flash memory array 102 to select a column to be accessed so that only the selected column is supplied with the control voltage from the slow ramp circuit 302. The row decoder 108 is connected at an input terminal to the flash memory array 102 and at an output terminal to an input terminal of the sense amplifier 110. When the control gate voltage applied to the selected memory cell increases and reaches its threshold gate voltage, drain current starts flowing through the selected memory cell. Such a drain current is supplied to the sense amplifier 110.

The sense amplifier 110 is connected at an output terminal to one of two input terminals of the AND gate 308. The sense amplifier 110 detects the drain current of the selected memory cell and reverses it. The AND gate 308 is connected at the other input terminal to an output terminal of the comparator 306 and at the output terminal to the pulse generating circuit 112. The AND gate 308 supplies a drive signal only when signals are supplied both from the comparator 306 and sense amplifier 110.

The pulse generating circuit 310 is connected at an output terminal to an input terminal of the sample and hold circuit 304. In response to the output signal of the AND gate 308, the pulse generating circuit 310 generates and supplies a sampling signal to the sample and hold circuit 304. The sample and hold circuit 304 samples and holds the control gate voltage supplied from the slow ramp circuit 302 in response to the sampling signal from the pulse generating circuit 310.

The comparator 306 compares the threshold gate voltage $V_{ramp}$ of the selected memory cell to lowest and highest acceptable values. In other words, the comparator 306 decides whether the threshold gate voltage $V_{ramp}$ of the selected memory cell is in a normal operation range. The comparator 306 supplies an output signal to the AND gate 308 when the threshold gate voltage $V_{ramp}$ of the selected memory cell is in the normal operation range, defined by the lowest and highest acceptable values.

The sample and hold circuit 304 normally outputs the threshold gate voltage $V_{ramp}$ as an analog output when the voltage $V_{ramp}$ is in the normal operation range. On the other hand, the sample and hold circuit 304 outputs the latest output signal $V_{ramp(t-1)}$ as an analog output when the voltage $V_{ramp}$ is out of the normal operation range.

In operation, the comparator 306 compares the threshold gate voltage $V_{ramp}$ of the currently selected memory cell to the lowest and highest acceptable values. As a result of the comparison, if the threshold gate voltage $V_{ramp}$ of the selected memory cell is in the range between the lowest and highest acceptable values, the comparator 306 supplies an output signal to the AND gate 308. At this time, the AND gate 308 is supplied with a signal from the sense amplifier 110. In response to those two input signals, the AND gate 308 supplies a drive signal to the pulse generating circuit 310.

In response to the drive signal, the pulse generating circuit 310 generates and supplies a sampling signal to the sample and hold circuit 304. When the sampling signal is supplied to the sample and hold circuit 304, an analog output signal corresponding to the threshold gate voltage $V_{ramp}$ of the selected memory cell is normally outputted.

On the other hand, as a result of the comparison, if the threshold gate voltage $V_{ramp}$ of the selected memory cell is out of the normal operation range, defined by the highest and lowest acceptable values, the comparator 306 supplies no output signal to the AND gate 308. The sample and hold circuit 304 supplies the latest output signal $V_{ramp(t-1)}$ as an analog output signal instead of the threshold gate voltage $V_{ramp(t-1)}$ of the currently selected memory cell.

Figure 8:
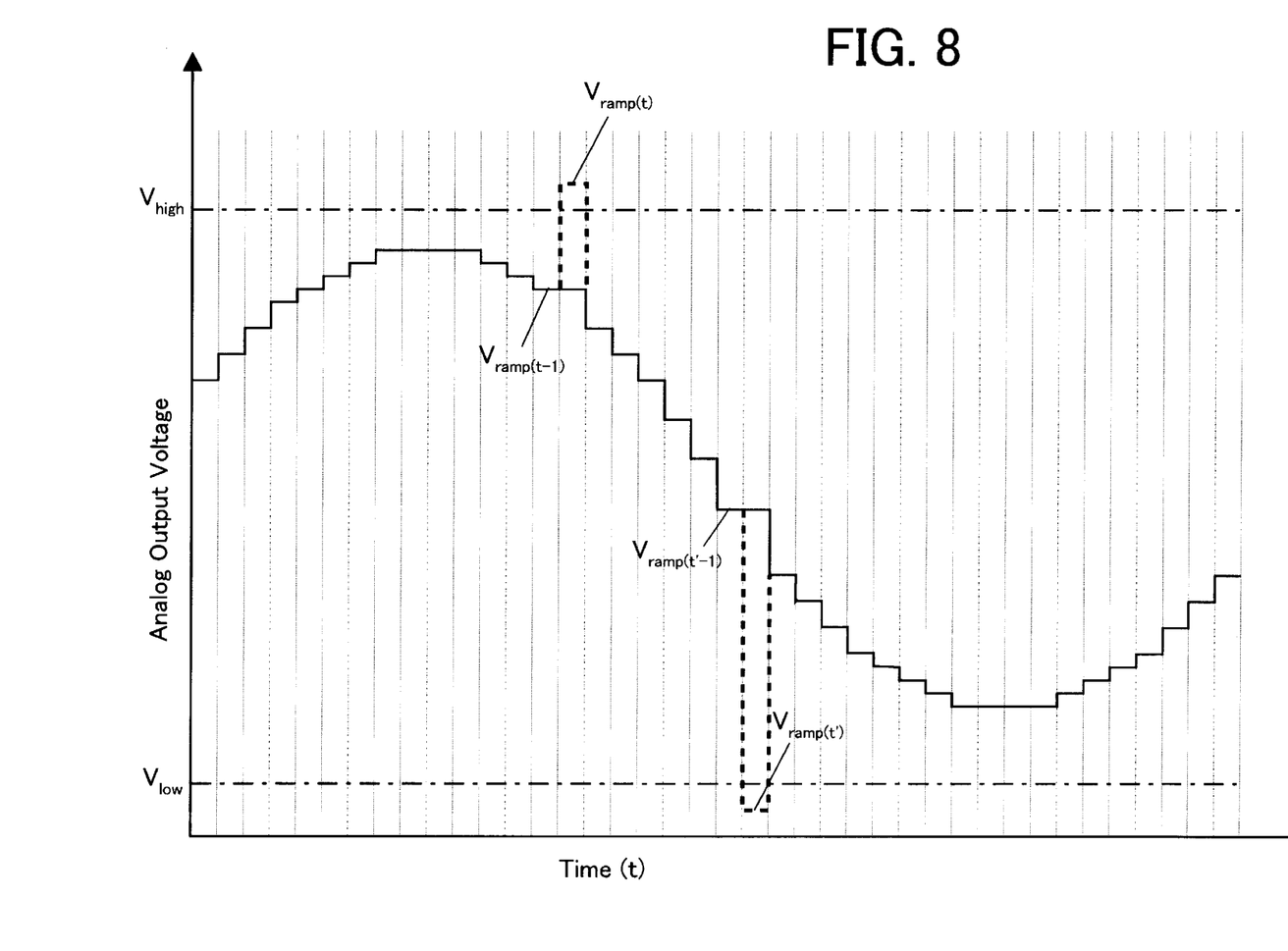
FIG. 8 is a graph showing the operation of the third preferred embodiment, shown in FIG. 7.

FIG. 8 shows the operation of the third preferred embodiment, shown in FIG. 7. As shown in FIG. 8, at a sampling time (t−1), the threshold gate voltage $V_{ramp(t-1)}$ of the selected memory cell is in the normal operation range, so that an analog output signal $V_{ramp(t-1)}$ is normally outputted. Next, at a sampling time (t), the threshold gate voltage $V_{ramp(t)}$ of the selected memory cell is larger than the highest acceptable value $V_{high}$, so that the latest output signal $V_{ramp(t-1)}$ is again outputted instead of $V_{ramp(t)}$.

At a sampling time (t'−1), the threshold gate voltage $V_{ramp(t'-1)}$ of the selected memory cell is in the normal operation range, so that an analog output signal $V_{ramp(t'-1)}$ is normally outputted. Next, at a sampling time (t'), the threshold gate voltage $V_{ramp(t')}$ of the selected memory cell is smaller than the lowest acceptable value $V_{low}$, so that the latest output signal $V_{ramp(t'-1)}$ is again outputted instead of $V_{ramp(t')}$.

According to the third preferred embodiment, even if the flash memory array 102 includes some failure bits, no error or strange signals are outputted from the memory device. If such an analog memory is used in a voice recorder, noise sounds is prevented from being made due to defectiveness of a memory array. In addition, even if the difference between threshold voltages of two continuously selected memory cells is very small, failure bits of the memory cell array can be detected; and therefore, the output signal can be normalized more precisely.

Although the above described embodiments are applied to flash memories, the present invention is not limited by flash memories, but the present invention can be applied to a variety types of analog memory devices.

What is claimed is:

1. A read-out circuit which reads analog data stored in memory cells, comprising:
   a data detecting circuit which detects analog data of a selected memory cell;
   a data condition deciding circuit which decides whether or not the analog data detected by the data detecting circuit is in a normal range; and
   a controller which normalizes the analog data of the selected memory cell in accordance with the decision of the data condition deciding circuit;
   wherein the data condition deciding circuit comprises a comparator which compares a predetermined reference value to the difference between the detected data of the currently selected memory cell and latest output data, which is outputted one step prior to the current step.

2. A read-out circuit according to claim 1, wherein the controller comprises:
   (1) a sample-and-hold circuit which stores the detected data of the selected memory cell,
   (2) a comparator which compares the detected data of the selected memory cell to lowest and highest acceptable values, wherein
   the detected data of the selected memory cell is outputted when the detected data is in between the lowest and highest acceptable values, while the latest output signal is outputted for the selected memory cell when the detected data of the selected memory cell is out of the range between the lowest and highest acceptable values.

3. A read-out circuit according to claim 1, wherein the data condition deciding circuit further comprises:
   (1) a first sample-and-hold circuit which stores the detected data of the currently selected memory cell; and
   (2) a second sample-and-hold circuit which stores the latest output data, wherein
   the data stored in the first and second sample-and-hold circuits are supplied to the comparator.

4. A read-out circuit according to claim 3, wherein the comparator supplies a drive signal when the difference between the detected data of the currently selected memory cell and latest output data is smaller than the reference value,
   the controller comprises a pulse generating circuit which generates a pulse signal in response to the drive signal supplied from the comparator and supplies it to the second sample-and-hold circuit so that the second sample-and-hold circuit outputs the detected data of the currently selected memory cell.

5. A read-out circuit according to claim 4, wherein the pulse generating circuit supplies no pulse signal to the second sample-and-hold circuit when the drive signal is not supplied from the comparator so that the second sample-and-hold circuit again outputs the latest output signal for the selected memory cell in stead of the currently detected data.

6. A read-out circuit according to claim 3, wherein the controller comprises:
   (1) a third sample-and-hold circuit which stores the difference between the latest output data and second latest output data to provide an adjust value; and
   (2) an adder which adds the adjust value supplied from the third sample-and-hold circuit to the latest output data so that the sum of the latest output data and the adjust value is supplied as a normalized output signal for the currently selected memory cell.

7. A read-out circuit according to claim 6, wherein the controller further comprises:
   a selector which selects one from the detected data of the selected memory cell and normalized output data in response to the control signal from the comparator, so that the detected data of the selected memory cell is outputted when the difference between the detected data of the selected memory cell and latest output data is smaller than the reference value, while the normalized output data is outputted when the difference between the detected data of the selected memory cell and latest output data is larger than the reference value.

8. A read-out circuit which reads analog data stored as threshold voltages of memory cells, comprising:

a slow ramp circuit, which supplies a control gate voltage changed continuously or step-wise;

a first sample-and-hold circuit which stores a threshold voltage of a currently selected memory cell;

a second sample-and-hold circuit which stores the latest threshold voltage, which is outputted one step prior to the current step;

a comparator which compares a predetermined reference value to the difference between the threshold voltage of the selected memory cell and latest output signal, and outputs a control signal when the difference is larger than the reference value; and a pulse generating circuit which generates a pulse signal in response to the control signal supplied from the comparator, and supplies it to the second sample-and-hold circuit so that the second sample-and-hold circuit supplies an output signal corresponding to the threshold voltage of the selected memory cell when the difference between the latest output signal and threshold voltage is smaller than the reference value, while outputs the latest output signal for the selected memory cell when the difference between the latest output signal and threshold voltage is larger than the reference value.

9. A read-out circuit which reads analog data stored as threshold voltages of memory cells, comprising:

a slow ramp circuit, which supplies a control gate voltage which is changed continuously or step-wise;

a first sample-and-hold circuit which stores a threshold voltage of a selected memory cell;

a second sample-and-hold circuit which stores the latest output signal, which is outputted one step prior to the current step;

a comparator which compares a predetermined reference value to the difference between the threshold voltage of the selected memory cell and latest output signal and outputs a control signal when the difference is larger than the reference value;

a pulse generating circuit which generates a pulse signal in response to the control signal supplied from the comparator;

a third sample-and-hold circuit which stores the difference between the latest output signal and second latest output signal as an adjust value;

an adder which adds the adjust value supplied from the third sample-and-hold circuit to the latest output signal in response to the control signal supplied from the comparator so that the sum of the latest output signal and the adjust value is supplied as a corrected output signal for the selected memory cell; and a selector which selects one from the threshold voltage of the selected memory cell and corrected output signal in response to the control signal from the comparator, so that the threshold voltage of the selected memory cell is outputted when the difference between the threshold voltage of the selected memory cell and latest output signal is smaller than the reference value, while the corrected output signal is outputted when the difference between the threshold voltage of the selected memory cell and latest output signal is larger than the reference value.

10. A method for reading analog data stored in memory cells, comprising the steps of:

detecting data of a selected memory cell;

deciding whether or not the detected data of the selected memory cell is in a normal range, and normalizing the analog data of the selected memory cell in accordance with the decision;

wherein the difference between the detected data of the currently selected memory cell and the latest output signal, which is outputted one step prior to the current step, is compared to a predetermined reference value so as to decide whether or not the detected data of the selected memory cell is in the normal range.

11. A method according to claim 10, further comprising the steps of:

storing the detected data of the selected memory cell;

storing the latest output data;

providing a predetermined reference value;

comparing the reference value to the difference between the detected data of the selected memory cell and latest output data; and supplying a control signal when the difference between the detected data of the selected memory cell and latest output data is larger than the reference value.

12. A method according to claims 11, further comprising the steps of.

providing the difference between the latest output data and second latest output data as an adjust value; and adding the adjust value to the latest output data in response to the control signal so that the sum of the latest output data and the adjust value is supplied as a normalized output data for the currently selected memory cell.

13. A method according to claim 12, further comprising the step of:

selecting one from the detected data of the selected memory cell and normalized output data in response to the control signal, so that the detected data of the selected memory cell are outputted when the difference between the detected data of the selected memory cell and latest output data is smaller than the reference value, while the normalized output data are outputted when the difference between the detected data of the selected memory cell and latest output data is larger than the reference value.

14. A method for reading analog data stored in memory cells, comprising the steps of:

detecting data of a selected memory cell;

deciding whether or not the detected data of the selected memory cell is in a normal range, and normalizing an output signal for the selected memory cell in accordance with the decision;

storing the detected data of the selected memory cell;

providing lowest and highest acceptable values;

comparing the voltage of the detected data of the selected memory cell to the lowest and highest acceptable values; and outputting the detected data of the selected memory cell when the detected data is in between the lowest and highest acceptable values, while outputting the latest output data for the selected memory cell when the detected data of the selected memory cell is out of the range between the lowest and highest acceptable values.

15. An analog memory, comprising:
a memory cell array having memory cells each storing analog data; and
a read-out circuit which reads the analog data from the memory cell array, the read-out circuit comprising:
(1) a data detecting circuit which detects analog data of a selected memory cell;
(2) a data condition deciding circuit which decides whether or not the analog data detected by the data detecting circuit is in a normal range; and
(3) a controller which normalizes the analog data of the selected memory cell in accordance with the decision of the data condition deciding circuit;
wherein the data condition deciding circuit comprises a comparator which compares a predetermined reference value to the difference between the detected data of the currently selected memory cell and latest output data, which is outputt one step prior to the current step, and supplies it to a second sample-and-hold circuit so that the second sample-and-hold circuit supplies an output signal corresponding to the gate threshold voltage of the selected memory cell when the difference between the latest output signal and gate threshold voltage is smaller than the reference value, which outputs the latest output signal for the selected memory cell when the difference between the latest output signal and gate threshold voltage is larger than the reference value.

16. An analog memory according to claim 15, wherein the controller comprises:
(1) a sample-and-hold circuit which stores the detected data of the selected memory cell,
(2) a comparator which compares the detected data of the selected memory cell to lowest and highest acceptable values, wherein
the detected data of the selected memory cell is outputted when the detected data is in between the lowest and highest acceptable values, while the latest output signal is outputted for the selected memory cell when the detected data of the selected memory cell is out of the range between the lowest and highest acceptable values.

17. An analog memory according to claim 15, wherein the data condition deciding circuit further comprises:
(1) a first sample-and-hold circuit which stores the detected data of the currently selected memory cell; and
(2) a second sample-and-hold circuit which stores the latest output data, wherein
the data stored in the first and second sample-and-hold circuits are supplied to the comparator.

18. An analog memory according to claim 17, wherein the comparator supplies a drive signal when the difference between the detected data of the currently selected memory cell and latest output data is smaller than the reference value,
the controller comprises a pulse generating circuit which generates a sampling signal in response to the drive signal supplied from the comparator and supplies it to the second sample-and-hold circuit so that the second sample-and-hold circuit outputs the detected data of the currently selected memory cell.

19. An analog memory according to claim 18, wherein the pulse generating circuit supplies no sampling signal to the second sample-and-hold circuit when the drive signal is not supplied from the comparator so that the second sample-and-hold circuit again outputs the latest output signal for the selected memory cell in stead of the currently detected data.

20. An analog memory, according to claim 17, wherein the controller comprises:
(1) a third sample-and-hold circuit which stores the difference between the latest output data and second latest output data to provide an adjust value; and
(2) an adder which adds the adjust value supplied from the third sample-and-hold circuit to the latest output data so that the sum of the latest output data and the adjust value is supplied as a normalized output signal for the currently selected memory cell.

21. An analog memory according to claim 20, wherein the controller further comprising:
a selector which selects one from the detected data of the selected memory cell and normalized output data in response to the control signal from the comparator, so that the detected data of the selected memory cell is outputted when the difference between the detected data of the selected memory cell and latest output data is smaller than the reference value, while the normalized output data is outputted when the difference between the detected data of the selected memory cell and latest output data is larger than the reference value.

22. An analog memory, comprising:
a memory cell array having memory cells each storing analog data as a threshold voltage thereof; and
a read-out circuit which reads the analog data from the memory cell array, the read-out circuit comprising:
(1) a slow ramp circuit, which supplies a control gate voltage changed continuously or step-wise;
(2) a first sample-and-hold circuit which stores a threshold voltage of a currently selected memory cell;
(3) a second sample-and-hold circuit which stores the latest threshold voltage, which is outputted one step prior to the current step;
(4) a comparator which compares a predetermined reference value to the difference between the threshold voltage of the selected memory cell and latest output signal, and outputs a control signal when the difference is larger than the reference value; and
(5) a pulse generating circuit which generates a pulse signal in response to the control signal supplied from the comparator, and supplies it to the second sample-and-hold circuit so that the second sample-and-hold circuit supplies an output signal corresponding to the threshold voltage of the selected memory cell when the difference between the latest output signal and threshold voltage is smaller than the reference value, while outputs the latest output signal for the selected memory cell when the difference between the latest output signal and threshold voltage is larger than the reference value.

23. An analog memory, comprising:
a memory cell array having memory cells each storing analog data as a threshold voltage thereof; and
a read-out circuit which reads the analog data from the memory cell array, the read-out circuit comprising:
(1) a slow ramp circuit, which supplies a control gate voltage which is changed continuously or step-wise;
(2) a first sample-and-hold circuit which stores a threshold voltage of a selected memory cell;
(3) a second sample-and-hold circuit which stores the latest output signal, which is outputted one step prior to the current step;

(4) a comparator which compares a predetermined reference value to the difference between the threshold voltage of the selected memory cell and latest threshold voltage and outputs a control signal when the difference is larger than the reference value;

(5) a pulse generating circuit which generates a pulse signal in response to the control signal supplied from the comparator;

(6) a third sample-and-hold circuit which stores the difference between the latest output signal and second latest output signal as an adjust value;

(7) an adder which adds the adjust value supplied from the third sample-and-hold circuit to the latest output signal in response to the control signal supplied from the comparator so that the sum of the latest output signal and the adjust value is supplied as a corrected output signal for the selected memory cell; and (8) a selector which selects one from the threshold voltage of the selected memory cell and corrected output signal in response to the control signal from the comparator, so that the threshold voltage of the selected memory cell is outputted when the difference between the threshold voltage of the selected memory cell and latest output signal is smaller than the reference value, while the corrected output signal is outputted when the difference between the threshold voltage of the selected memory cell and latest output signal is larger than the reference value.

\* \* \* \* \*